(12) United States Patent
Aderhold

(10) Patent No.: US 12,588,455 B2
(45) Date of Patent: Mar. 24, 2026

(54) DOPANT DIFFUSION WITH SHORT HIGH TEMPERATURE ANNEAL PULSES

(71) Applicant: Applied Materials, Inc., Santa Clara, CA (US)

(72) Inventor: Wolfgang R. Aderhold, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 814 days.

(21) Appl. No.: 17/842,381

(22) Filed: Jun. 16, 2022

(65) Prior Publication Data

US 2023/0411183 A1 Dec. 21, 2023

(51) Int. Cl.
| | |
|---|---|
| *H01L 21/67* | (2006.01) |
| *H01L 21/225* | (2006.01) |
| *H01L 21/268* | (2006.01) |
| *H01L 21/324* | (2006.01) |
| *H10D 62/834* | (2025.01) |

(52) U.S. Cl.
CPC .... *H01L 21/67115* (2013.01); *H01L 21/2254* (2013.01); *H01L 21/268* (2013.01); *H01L 21/324* (2013.01); *H10D 62/834* (2025.01)

(58) Field of Classification Search
CPC ............... H01L 21/225; H01L 21/2251; H01L 21/2255; H01L 21/324
See application file for complete search history.

(56) References Cited

U.S. PATENT DOCUMENTS

| | | | | |
|---|---|---|---|---|
| 2002/0034845 A1* | 3/2002 | Fujimura | .......... | H01L 21/02502 |
| | | | | 257/E27.111 |
| 2004/0209447 A1* | 10/2004 | Gosain | .................... | C30B 13/34 |
| | | | | 438/486 |
| 2004/0211356 A1* | 10/2004 | Yamazaki | ............... | C23C 14/48 |
| | | | | 117/84 |

(Continued)

FOREIGN PATENT DOCUMENTS

| | | |
|---|---|---|
| KR | 10-2002-0022012 A | 3/2002 |
| KR | 10-2004-0018140 A | 3/2004 |

(Continued)

OTHER PUBLICATIONS

PCT/US2023/023956, International Search Report and Written Opinion dated Sep. 19, 2023, 14 pages.

(Continued)

*Primary Examiner* — Mary A Wilczewski
(74) *Attorney, Agent, or Firm* — Patterson + Sheridan, LLP

(57) ABSTRACT

A method and apparatus for diffusing a dopant within a semiconductor device is described. The method includes performing a dynamic surface anneal in which a substrate is placed inside of a process volume with a mixture of an inert gas and a small amount of oxygen gas. The surface of the substrate is then exposed to one or more rapid laser pulses. The rapid laser bursts diffuse dopant from a doped layer into the substrate. The doped layer is formed during a previous process operation. The temperature and number of laser pulses control the amount of diffusion of the dopant into the substrate. Other dynamic surface anneal operations may be optionally performed before or after the oxygenated dynamic surface anneal operation.

18 Claims, 6 Drawing Sheets

(56)                 References Cited

U.S. PATENT DOCUMENTS

| | | | |
|---|---|---|---|
| 2007/0212859 A1* | 9/2007 | Carey | H10D 30/0221 |
| | | | 257/E21.336 |
| 2007/0232033 A1 | 10/2007 | Wieczorek et al. | |
| 2009/0256172 A1 | 10/2009 | Lim et al. | |
| 2012/0171804 A1 | 7/2012 | Moslehi et al. | |
| 2015/0311067 A1 | 10/2015 | Sharma et al. | |
| 2017/0110321 A1 | 4/2017 | Cheng et al. | |
| 2019/0019679 A1* | 1/2019 | Iguchi | H01L 21/0495 |
| 2020/0051818 A1 | 2/2020 | Aderhold et al. | |
| 2020/0161134 A1 | 5/2020 | Colombeau et al. | |
| 2023/0411183 A1* | 12/2023 | Aderhold | H01L 21/2254 |

FOREIGN PATENT DOCUMENTS

| | | |
|---|---|---|
| KR | 10-2009-0107951 A | 10/2009 |
| KR | 10-2018-0055835 A | 5/2018 |
| WO | 2009128679 A2 | 10/2009 |

OTHER PUBLICATIONS

Korean Patent Application No. 1020257001141, Office Action dated Jun. 11, 2025, 12 pages.

* cited by examiner

DOPANT DIFFUSION WITH SHORT HIGH TEMPERATURE ANNEAL PULSES

BACKGROUND

Field

Embodiments of the present disclosure generally relate to a method of forming a device. More specifically, embodiments of the present disclosure relate to a method of doping a substrate which is part of a semiconductor device.

Description of the Related Art

Microelectronic devices are fabricated on a semiconductor substrate as integrated circuits in which various conductive layers are interconnected with one another to permit electronic signals to propagate within the device. An example of such as device is a complementary metal-oxide-semiconductor (CMOS) field effect transistor (FET) or MOSFET. The FET may utilize a fin or a gate all around structure. More complex structures, such as fin and gate all around structures, require doping approaches which are utilized outside of the line of sight of a dopant or heat source.

Current doping methods suffer from poor dopant uniformity, poor repeatability of the dopant profile, defects within the dopant profile, undesired shape modification of the dopant profile, and larger than desired dopant diffusion into a device structure. In some dopant diffusion operations, such as bake anneals or rapid thermal processing (RTP) anneals, the dopant is diffused past a desired region in the device and limits the minimum size of the semiconductor device. Some methods of diffusing dopants utilize temperatures which either melt or deform the semiconductor device. In some operations, repeated heating is found to deform the semiconductor device.

Therefore, apparatus and methods are desired for enabling controlled diffusion of dopants into a semiconductor device which have reduced temperatures and cycling.

SUMMARY

The present disclosure generally relates to the formation of a doped region within a semiconductor device structure. In one embodiment, a method of diffusing a dopant, suitable for use during semiconductor processing, is described. The method includes flowing an inert gas into a process volume of a process chamber, flowing an oxygen gas into the process volume such that an oxygen partial pressure of the oxygen gas is about 0.1% to about 10% within the process volume, and exposing a portion of a substrate within the process volume to one or more laser pulses to heat the portion of the substrate to a temperature of greater than about 850° C.

In another embodiment, a method of diffusing a dopant into a semiconductor device structure includes depositing a doped layer with a dopant, the doped layer having a dopant concentration of greater than about $1·10^{20}$ atoms/cm3 on a top surface of a substrate in a first process chamber and performing an oxygenated dynamic surface anneal. The oxygenated dynamic surface anneal includes flowing an inert gas into a process volume of a second process chamber, flowing an oxygen gas into the process volume of the second process chamber such that an oxygen partial pressure of the oxygen gas is about 0.1% to about 10% within the process volume, and exposing a portion of a substrate within the process volume to a one or more laser pulses to heat the portion of the substrate to a temperature of greater than about 800° C.

In yet another embodiment, a method of diffusing a dopant into a semiconductor device structure includes selectively depositing a doped layer with a dopant on a top surface of a substrate within a first process chamber. The doped layer has a dopant concentration of greater than about $1·10^{21}$ atoms/cm3. The method further includes performing an oxygenated dynamic surface anneal to diffuse the dopant into the substrate. The oxygenated dynamic surface anneal includes flowing an inert gas into a process volume of a second process chamber, flowing an oxygen gas into the process volume of the second process chamber such that an oxygen partial pressure of the oxygen gas is about 0.1% to about 10% within the process volume, exposing a portion of a substrate within the process volume to a plurality of laser pulses to heat the portion of the substrate to a temperature of greater than about 800° C. and diffuse the dopant into the substrate, and removing an oxide formed on the substrate after the diffusing the dopant.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
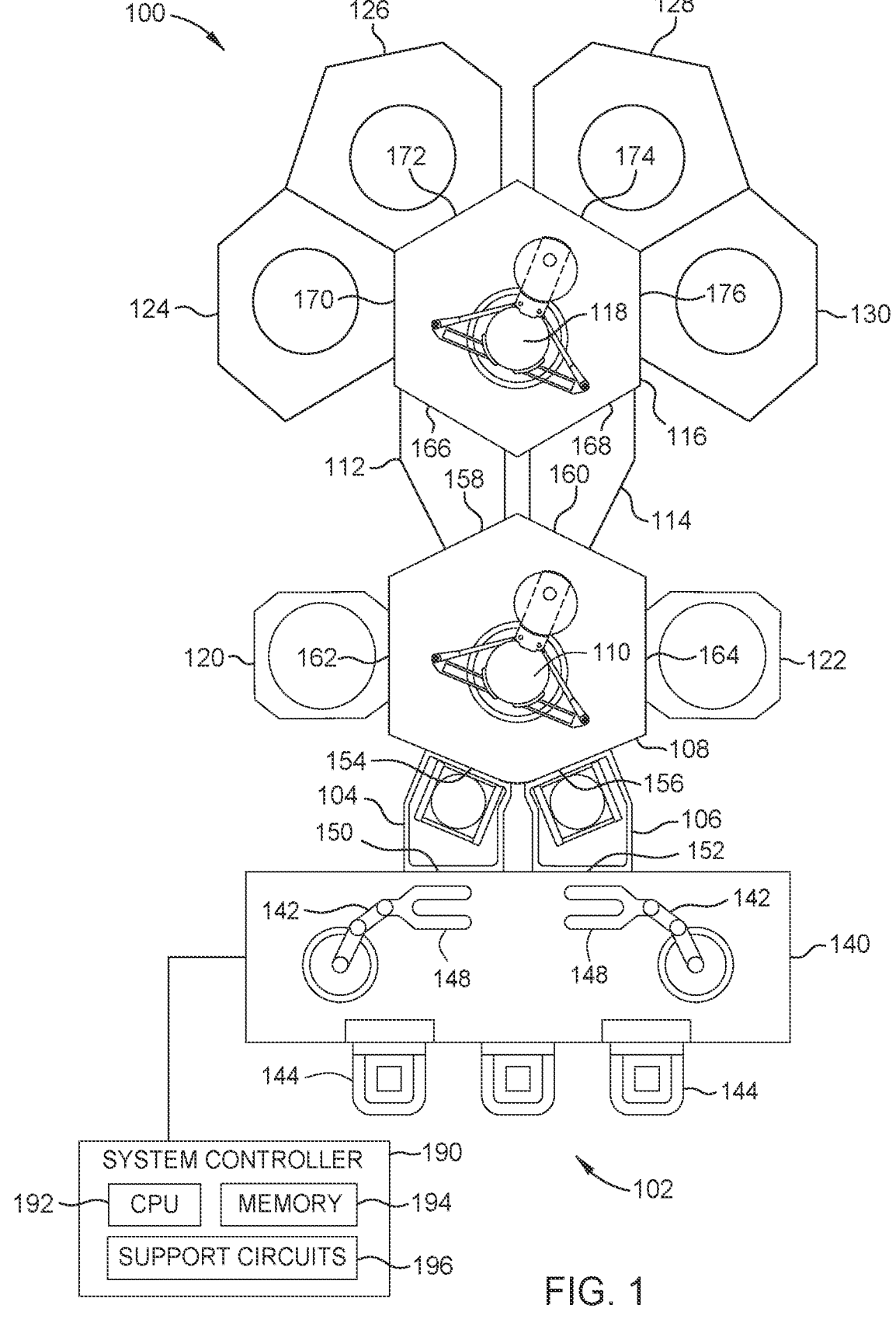
FIG. 1 is a schematic plan view of an example of a semiconductor processing system, according to one or more embodiments of the disclosure.

The present disclosure is directed towards a method and corresponding apparatus for diffusing a dopant into a substrate using rapid high temperature anneal pulses. The rapid high temperature anneal pulses are dynamic surface anneal (DSA) pulses, such that laser pulses are applied to the surface of a substrate using a laser source. The laser pulses are performed in a laser annealing chamber, such as a DSA chamber. One exemplary chamber is the Astra DSA® chamber available from Applied Materials, Inc. of Santa Clara, Calif. Each process chamber used to practice embodiments of the disclosure may be operated individually, or as part of a cluster tool, such as one of the CENTURA® line of cluster tools, available from Applied Materials, Inc. of Santa Clara, Calif.

The rapid high temperature anneal pulses are performed on a substrate with one or more features. A doped layer is previously formed on the substrate during a deposition process, such as an epitaxial deposition process. After deposition of the doped layer, the substrate is moved into the anneal chamber for one or more DSA operations. During at least one of the DSA operations, the process volume within the anneal chamber is filled with an inert gas and a small amount of oxygen. The DSA operations may be scanning DSA operations and may be performed in a scanning DSA chamber. The oxygen within the process volume has been shown to decrease the anneal temperature needed to obtain predetermined process results and has also been shown to reduce the number of anneal cycles which are used to obtain desired results. Reducing the anneal temperature and the number of anneal cycles decreases deformation and strain on the substrate while obtaining similar dopant diffusion results. Dopants which may be diffused using the methods discussed herein include boron and phosphorous. The number of cycles of the oxygen-enhanced diffusion annealing may be less than 10 cycles, such as 3 to 5 cycles to obtain a doped region which has a dopant concentration of greater than about $1 \cdot 10^{12}$ atoms/cm$^3$, such as a concentration of greater than $1 \cdot 10^{15}$ atoms/cm$^3$, such as a dopant concentration of greater than about $1 \cdot 10^{18}$ atoms/cm$^3$, such as a dopant concentration of greater than about $1 \cdot 10^{19}$ atoms/cm$^3$, such as a dopant concentration of greater than about $1 \cdot 10^{20}$ atoms/cm$^3$, such as a dopant concentration of greater than about $2 \cdot 10^{20}$ atoms/cm$^3$, such as a dopant concentration of greater than about $5 \cdot 10^{20}$ atoms/cm$^3$ at a depth of 5 nm from the top surface of the substrate. The amount of oxygen is enough to reduce the processing temperature and the number of anneal cycles, but limits the amount of oxide growth on the substrate. The oxygen within the process volume has a partial pressure of about 0.1% to about 10% of the total pressure within the process volume, such as about 0.5% to about 5%, such as about 0.7% to about 2%, such as about 1%.

By utilizing the amount of oxygen discussed herein, the number of cycles and the temperature is reduced compared to embodiments where no oxygen is utilized. In one example, it is possible to obtain similar process results with 3 to 5 anneal cycles at a temperature of 1150° C. when using oxygen. Without any oxygen similar process results would take 20 to 30 cycles of similar anneal times and methods at a temperature of 1200° C. or greater. As the melting point of a silicon substrate is about 1414° C., the substrate may be deformed or stressed with the additional cycles close to the silicon melting point.

It has been found that if the concentration of oxygen within the inert gas volume is not controlled to appropriate levels, the diffusion and activation of dopant within the device structure is non-uniform and unpredictable. In one example, if an atmospheric system is utilized with insufficient purging of the system, the composition of the gas within the process volume may change during processing, such that there is a higher oxygen concentration at a beginning of the process and the oxygen concentration decreases throughout the process. The variation of the oxygen concentration causes large variation of process results from the beginning to the end of the DSA process operation or a similar process operation with multiple pulses and scanning across the substrate.

Anneal processes as described herein refer to processes performed at a temperature greater than about 600 degrees Celsius, such as a temperature of greater than about 700 degrees Celsius. Laser anneal processes may deliver a constant energy flux from an energy source to a small region on the surface of the substrate while the substrate is translated, or scanned, relative to the energy (or vice versa) delivered to the small region. The energy source may deliver electromagnetic radiation energy to perform the annealing process at desired regions of the substrate. Typical sources of electromagnetic radiation energy include, but are not limited to, an optical radiation source, an electron beam source, an ion beam source, and/or a microwave energy source, any of which may be monochronistic or polychronistic and may have any desired coherency. In one embodiment, the energy source is an optical radiation source using one or more laser sources. The lasers may be any type of laser such as gas laser, excimer laser, solid-state laser, fiber laser, semiconductor laser etc., which may be configurable to emit light at a single wavelength or at two or more wavelengths simultaneously.

The laser anneal process may take place on a given region of the substrate for a relatively short time, such as on the order of about one second or less. In various embodiments, the laser anneal process is performed on the order of milliseconds.

FIG. 1 is a schematic plan view diagram of an example of a semiconductor processing system 100 according to one or more embodiments. The processing system 100 generally includes a factory interface 102, load lock chambers 104, 106, transfer chambers 108, 116 with respective transfer robots 110, 118, holding chambers 112, 114, and processing chambers 120, 122, 124, 126, 128, 130. As detailed herein, substrates in the processing system 100 can be processed in and transferred between the various chambers without being exposed to an ambient environment exterior to the processing system 100. For example, substrates can be processed in and transferred between the various chambers in a low pressure (e.g., less than or equal to about 300 Torr) or vacuum environment without breaking the low pressure or vacuum environment between various processes performed on the substrates in the processing system 100. Accordingly, the processing system 100 may provide for an integrated solution for some processing of substrates.

Examples of a processing system that may be suitably modified in accordance with the disclosure provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 140 and factory interface robots 142 disposed within the docking station 140 to facilitate transfer of substrates. The docking station 140 is coupled to one or more front opening unified pods (FOUPs) 144. In some examples, each factory interface robot 142 generally comprises a blade 148 disposed on one end of the respective factory interface robot 142 configured to transfer substrates from the factory interface 102 to the load lock chambers 104, 106.

The load lock chambers 104, 106 have respective ports 150, 152 coupled to the factory interface 102 and respective ports 154, 156 coupled to the transfer chamber 108. The transfer chamber 108 further has respective ports 158, 160 coupled to the holding chambers 112, 114 and respective ports 162, 164 coupled to processing chambers 120, 122. Similarly, the transfer chamber 116 has respective ports 166, 168 coupled to the holding chambers 112, 114 and respective ports 170, 172, 174, 176 coupled to processing chambers 124, 126, 128, 130. The ports 154, 156, 158, 160, 162, 164, 166, 168, 170, 172, 174, 176 can be, for example, slit openings with slit valves for passing substrates therethrough by the transfer robots 110, 118 and for providing a seal between respective chambers to prevent a gas from passing between the respective chambers. Generally, any port is open for transferring a substrate therethrough; otherwise, the port is closed.

The load lock chambers 104, 106, transfer chambers 108, 116, holding chambers 112, 114, and processing chambers 120, 122, 124, 126, 128, 130 may be fluidly coupled to a gas and pressure control system. The gas and pressure control system can include one or more gas pumps (e.g., turbo pumps, cryo-pumps, roughing pumps, etc.), gas sources, various valves, and conduits fluidly coupled to the various chambers. In operation, a factory interface robot 142 transfers a substrate from a FOUP 144 through a port 150 or 152 to a load lock chamber 104 or 106. The gas and pressure control system then pumps down the load lock chamber 104 or 106. The gas and pressure control system further maintains the transfer chambers 108, 116 and holding chambers 112, 114 with an interior low pressure or vacuum environment (which may include an inert gas). Hence, the pumping down of the load lock chamber 104 or 106 facilitates passing the substrate between e.g., the atmospheric environment of the factory interface 102 and the low pressure or vacuum environment of the transfer chamber 108.

The processing chambers 120, 122, 124, 126, 128, 130 can be any appropriate chamber for processing a substrate. In some examples, the processing chamber 122 can be capable of performing a cleaning process; the processing chamber 120 can be capable of performing an etch process; and the processing chambers 124, 126, 128, 130 can be capable of performing respective epitaxial growth processes. Others of the processing chambers 124, 126, 128, 130 may be annealing chambers, such as a DSA chamber. The annealing chamber may be an Astra DSA® chamber available from Applied Materials of Santa Clara, Calif. The DSA chamber may be a scanning DSA chamber. The processing chamber 122 may be a SiCoNi™ Preclean chamber available from Applied Materials of Santa Clara, Calif. The processing chamber 120 may be a Selectra™ Etch chamber available from Applied Materials of Santa Clara, Calif. Other chambers, including those from other manufacturers, are also contemplated.

A system controller 190 is coupled to the processing system 100 for controlling the processing system 100 or components thereof. For example, the system controller 190 may control the operation of the processing system 100 using a direct control of the chambers 104, 106, 108, 112, 114, 116, 120, 122, 124, 126, 128, 130 of the processing system 100 or by controlling controllers associated with the chambers 104, 106, 108, 112, 114, 116, 120, 122, 124, 126, 128, 130. In operation, the system controller 190 enables data collection and feedback from the respective chambers to coordinate performance of the processing system 100.

The system controller 190 generally includes a central processing unit (CPU) 192, memory 194, and support circuits 196. The CPU 192 may be one of any form of a general purpose processor that can be used in an industrial setting. The memory 194, or non-transitory computer-readable medium, is accessible by the CPU 192 and may be one or more of memory such as random access memory (RAM), read only memory (ROM), floppy disk, hard disk, or any other form of digital storage, local or remote. The support circuits 196 are coupled to the CPU 192 and may comprise cache, clock circuits, input/output subsystems, power supplies, and the like. The various methods disclosed herein may generally be implemented under the control of the CPU 192 by the CPU 192 executing computer instruction code stored in the memory 194 (or in memory of a particular processing chamber) as, e.g., a software routine. When the computer instruction code is executed by the CPU 192, the CPU 192 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 116 and the holding chambers 112, 114. In other examples, more or fewer transfer chambers (e.g., one transfer chamber) and/or more or fewer holding chambers (e.g., no holding chambers) may be implemented as a transfer apparatus in a processing system.

Figure 2:
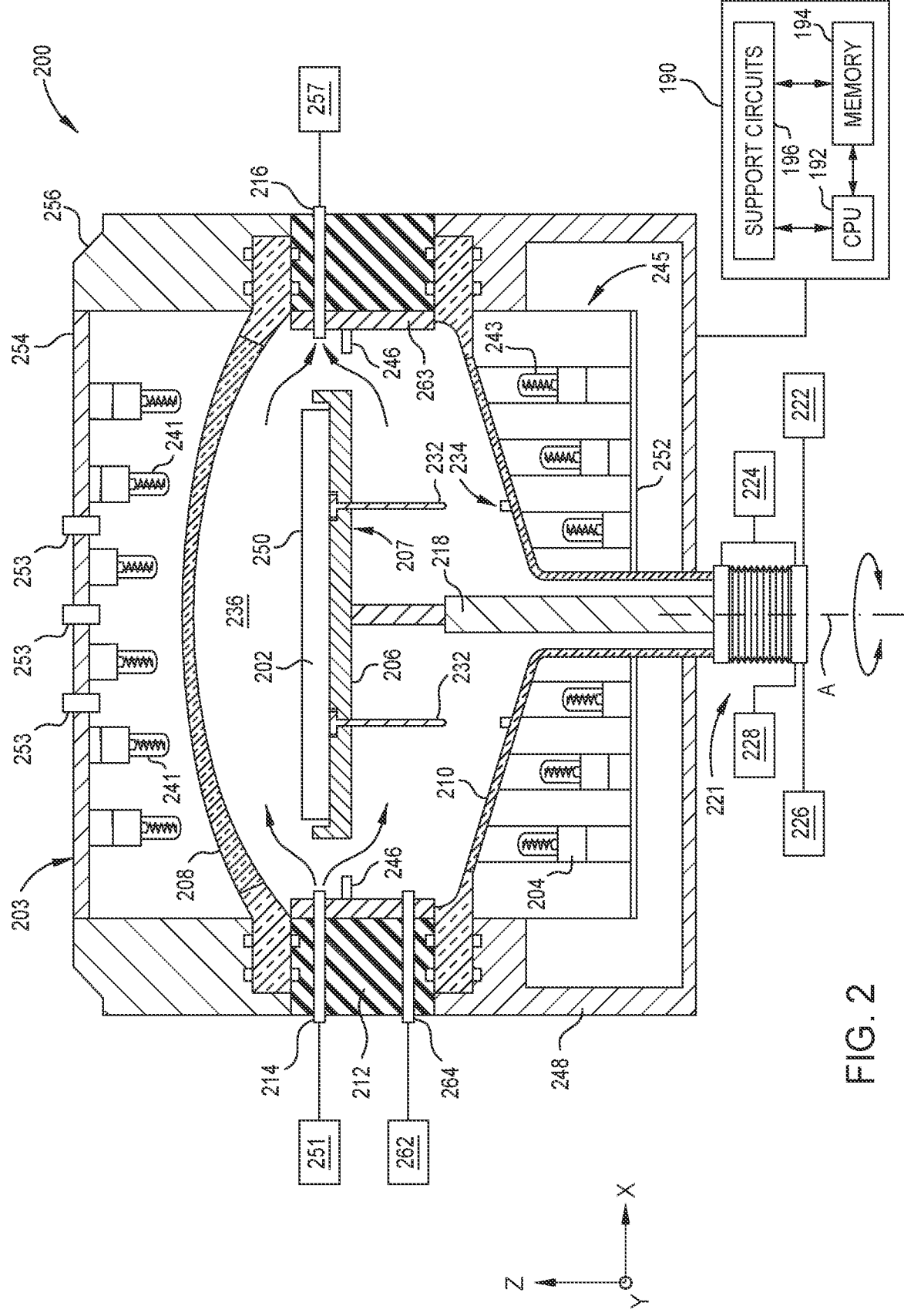
FIG. 2 is a schematic cross-sectional view of a type of deposition chamber, according to one embodiment of the disclosure.

FIG. 2 is a schematic illustration of a type of deposition chamber 200 according to one embodiment of the present disclosure. The deposition chamber 200 is utilized to grow an epitaxial film on a substrate, such as the substrate 202. The deposition chamber 200 creates a cross-flow of precursors across the top surface 250 of the substrate 202.

The deposition chamber 200 includes an upper body 256, a lower body 248 disposed below the upper body 256, a flow module 212 disposed between the upper body 256 and the lower body 248. The upper body 256, the flow module 212, and the lower body 248 form a chamber body. Disposed within the chamber body is a substrate support 206, an upper transmission member 208, a lower transmission member 210, a plurality of upper lamps 241, and a plurality of lower lamps 243. As shown, the system controller 190 is in communication with the deposition chamber 200 and is used to control processes, such as those described herein. The substrate support 206 is disposed between the upper transmission member 208 and the lower transmission member 210. The plurality of upper lamps 241 are disposed between the upper transmission member 208 and a lid 254. The lid 254 includes a plurality of sensors 253 disposed therein for measuring the temperature within the deposition chamber 200. The plurality of lower lamps 243 are disposed between the lower transmission member 210 and a floor 252. The plurality of lower lamps 243 form a lower lamp assembly 245.

A processing volume 236 is formed between the upper transmission member 208 and the lower transmission member 210. The upper transmission member 208 and the lower transmission member 210 are quartz domes and are configured to transfer radiant energy from the plurality of upper and lower lamps 241, 243 to the process volume 236 and the substrate support 206 within the process volume. The substrate support 206 includes a top surface on which the substrate 202 is disposed. The substrate support 206 is attached to a shaft 218. The shaft 218 is connected to a motion assembly 221. The motion assembly 221 includes one or more actuators and/or adjustment devices that provide movement and/or adjustment of the shaft 218 and/or the substrate support 206 within the processing volume 236. The motion assembly 221 includes a rotary actuator 222 that rotates the shaft 218 and/or the substrate support 206 about a longitudinal axis A of the deposition chamber 200. The motion assembly 221 further includes a vertical actuator 224 to lift and lower the substrate support 206 in the z-direction. The motion assembly includes a tilt adjustment device 226 that is used to adjust the planar orientation of the substrate support 206 and a lateral adjustment device 228 that is used to adjust the position of the shaft 218 and the substrate support 206 side to side within the processing volume 236.

The substrate support 206 may include lift pin holes 207 disposed therein. The lift pin holes 207 are sized to accommodate a lift pin 232 for lifting of the substrate 202 from the substrate support 206 either before or after a deposition process is performed. The lift pins 232 may rest on lift pin stops 234 when the substrate support 206 is lowered from a processing position to a transfer position.

The flow module 212 includes a plurality of process gas inlets 214, a plurality of purge gas inlets 264, and one or more exhaust gas outlets 216. The plurality of process gas inlets 214 and the plurality of purge gas inlets 264 are disposed on the opposite side of the flow module 212 from the one or more exhaust gas outlets 216. One or more flow guides 246 are disposed below the plurality of process gas inlets 214 and the one or more exhaust gas outlets 216. The flow guide 246 is disposed above the purge gas inlets 264. A liner 263 is disposed on the inner surface of the flow module 212 and protects the flow module 212 from reactive gases used during deposition processes. The process gas inlets 214 and the purge gas inlets 264 are positioned to flow a gas parallel to the top surface 250 of a substrate 202 disposed within the processing volume 236. The process gas inlets 214 are fluidly connected to a process gas source 251. The purge gas inlets 264 are fluidly connected to a purge gas source 262. The one or more exhaust gas outlets 216 are fluidly connected to an exhaust pump 257. Each of the process gas source 251 and the purge gas source 262 may be configured to supply one or more precursors or process gases into the processing volume 236.

Figure 3:
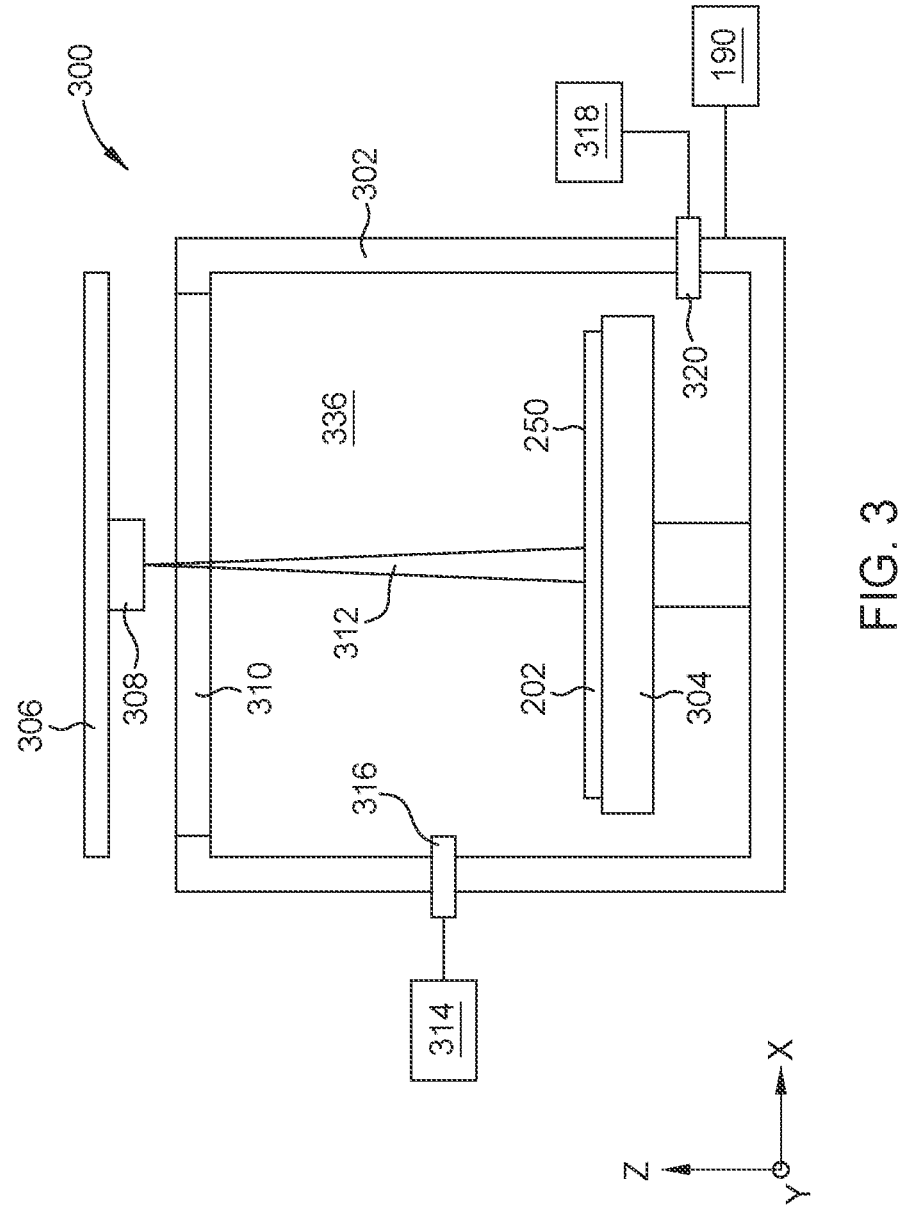
FIG. 3 is a schematic cross-sectional view of a type of surface anneal chamber, according to one embodiment of the disclosure.

FIG. 3 is a schematic cross-sectional view of a type of surface anneal chamber 300. The surface anneal chamber 300 is a DSA chamber, such that a laser beam 312 is utilized to heat the top surface 250 of the substrate 202. The DSA chamber may be a scanning DSA chamber. The laser beam 312 is emitted by a laser source 308 which is coupled to an actuation assembly 306. The actuation assembly 306 may include one or more tracks, motors, or pneumatics for moving the laser source 308 over different portions of the substrate 202. The substrate 202 is disposed within a process volume 336 of the surface anneal chamber 300 and on a substrate support 304. The process volume 336 is formed by an anneal chamber body 302. The anneal chamber body 302 includes the substrate support 304 disposed therein.

A window 310 is disposed through a top of the anneal chamber body 302 such that the window 310 is disposed through a portion of the lid of the anneal chamber body 302. The laser source 308 and the actuation assembly 306 are disposed outside of the process volume 336 on an opposite side of the window 310 from the substrate support 304. The window 310 is a transmission member and is optically transparent at the wavelength of the laser beam 312, such that more than 90% of the radiant energy from the laser beam 312 passes through the window 310 without being absorbed.

The laser source 308 is configured to scan along the top surface 250 of the substrate 202. The laser source 308 may be configured to either emit a long laser pulse while scanning or the laser source 308 may be configured to apply a plurality of small laser pulses to the substrate 202. In some embodiments, the laser source 308 is configured to emit one or more laser pulses, such as a plurality of laser pulses, with a pulse duration of less than about 1 second, such as less than about 0.5 seconds, such as less than about 0.1 seconds. In some embodiments, the pulse duration is several nanoseconds or several milliseconds. Nanosecond or millisecond annealing process is believed to enable precise control of the placement of dopants (e.g., phosphorus) in the crystalline lattice structure while limiting diffusion of the dopants to an extent that exceeds manufacturing tolerances and therefore deactivates the dopants. Very fast heating of the amorphized, implanted region is advantageous in some applications as it minimizes substrate damage due to thermal stress while achieving melting of the amorphized region before the amorphized region crystallizes.

In some implementations, nanosecond pulsed lasers having a pulse duration from a few nanoseconds to about 200 nanoseconds, such as between 10 nsec and 100 nsec, for example 20 nsec, may be used to melt the implanted regions. The energy delivered in each pulse may be between about 10 $mJ/cm^2$ and 1.0 $J/cm^2$, such as between about 100 $mJ/cm^2$ and about 500 $mJ/cm^2$, for example about 300 $mJ/cm^2$. The repetition rate of the energy pulse may be between about 1 kHz and about 1 MHz, such as between about 10 kHz and about 250 kHz, for example about 50 kHz to about 100 kHz. The exposure to the laser pulses during laser anneal process is repeated. In some embodiments, the laser source 308 is configured to emit the laser beam 312 with a wavelength of about nm to about 2,000 nm, such as about 190 nm to about 1064 nm, such as about 365 nm to about 536 nm. The pulsing of lasers allows complete recrystallization via melt and super-activation at a lower thermal budget as single pulse anneal.

A gas inlet 316 and an exhaust outlet 320 are disposed through sidewalls of the anneal chamber body 302. The gas inlet 316 is disposed on an opposite side of the anneal chamber body 302 from the exhaust outlet 320. The gas inlet 316 may be one or more gas inlets, such that one gas inlet is configured to introduce a first gas or precursor and a second gas inlet is configured to introduce a second gas or precursor. A gas source 314 is coupled to the gas inlet 316 and configured to supply one or more precursors or other process gases. In some embodiments, the gas source 314 is configured to supply an inert gas, such as one or a combination of an argon gas, nitrogen gas, helium gas, neon gas, krypton gas, or xenon gas to the process volume 336. The gas source 314 may be further configured to supply an oxygen containing gas, such as oxygen gas ($O_2$) or ionic oxygen ($O^{2-}$).

An exhaust vacuum 318 is coupled to the exhaust outlet 320 and is configured to evacuate gas from the process volume 336. In some embodiments there are more than one exhaust outlet 320. The system controller 190 is coupled to the surface anneal chamber 300 and is configured to control the laser source 308, the actuation assembly, the movement of the substrate support 304, the gas source 314, and the exhaust vacuum 318.

Figure 4A:
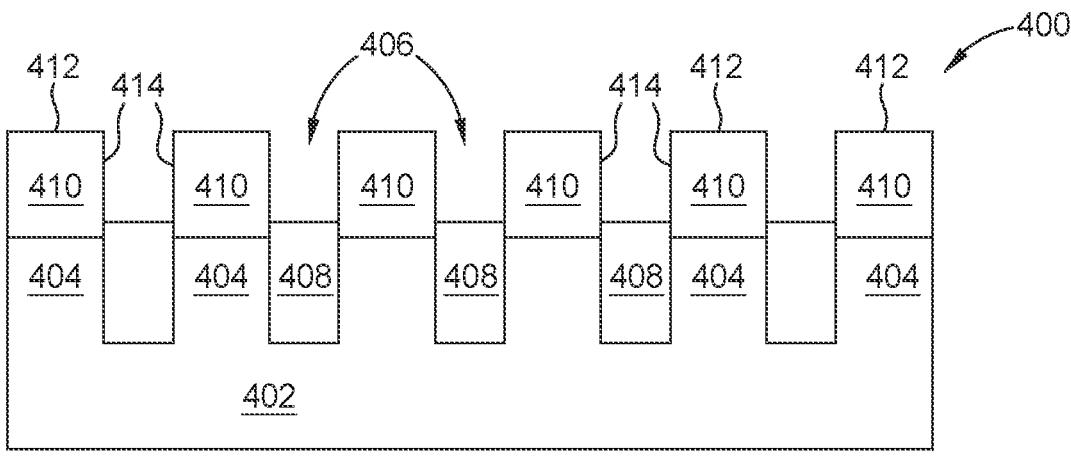
FIGS. 4A-4C are schematic cross-sectional views of a semiconductor device during various stages of formation, according to one or more embodiments of the disclosure.
Figure 4B:
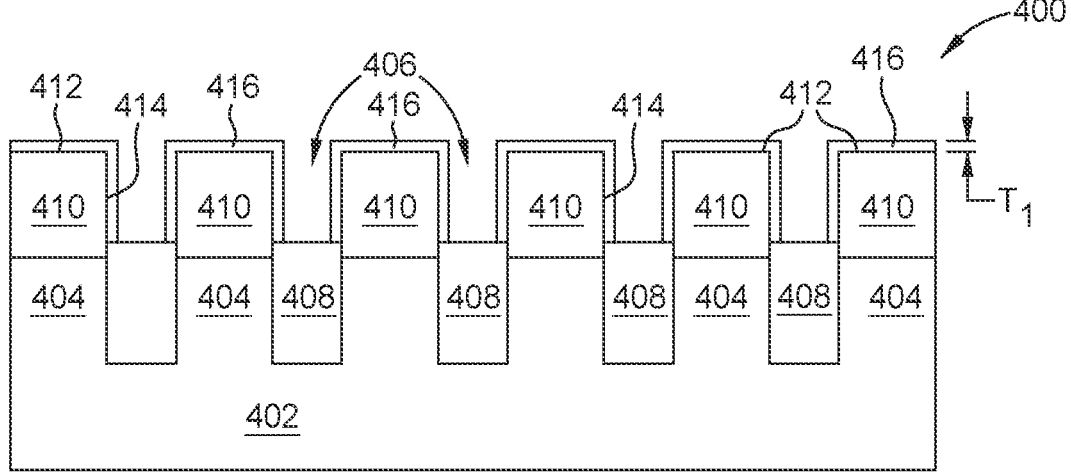
Figure 4C:
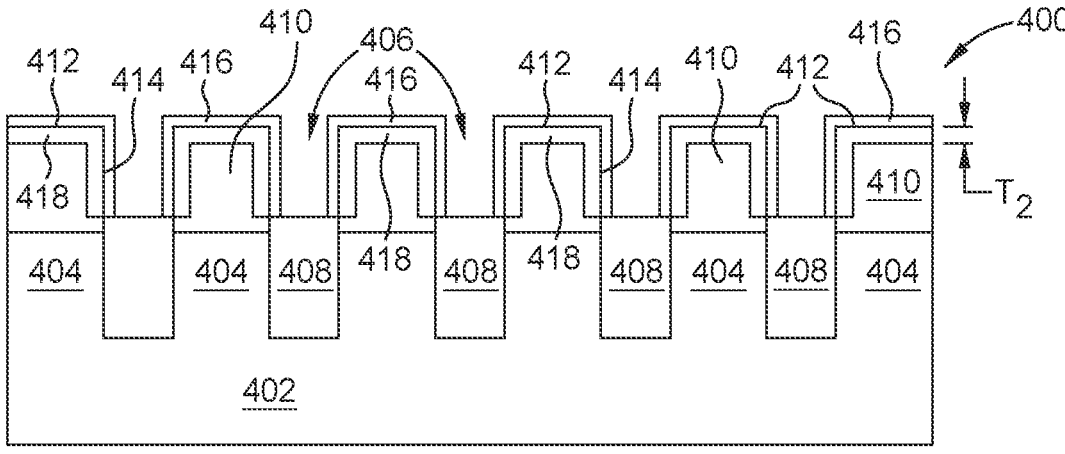

FIGS. 4A-4C are schematic cross-sectional views of a semiconductor device 400 during various stages of formation. The semiconductor device 400 may be formed on a substrate, such as the substrate 202, using the semiconductor processing system 100, the deposition chamber 200 and the surface anneal chamber 300 of FIG. 1, FIG. 2, and FIG. 3 respectively. The semiconductor device 400 may have a FIN structure. The various stages illustrated in FIGS. 4A-4C illustrate the formation of a doped region within the structures of the semiconductor device 400.

Figure 6:
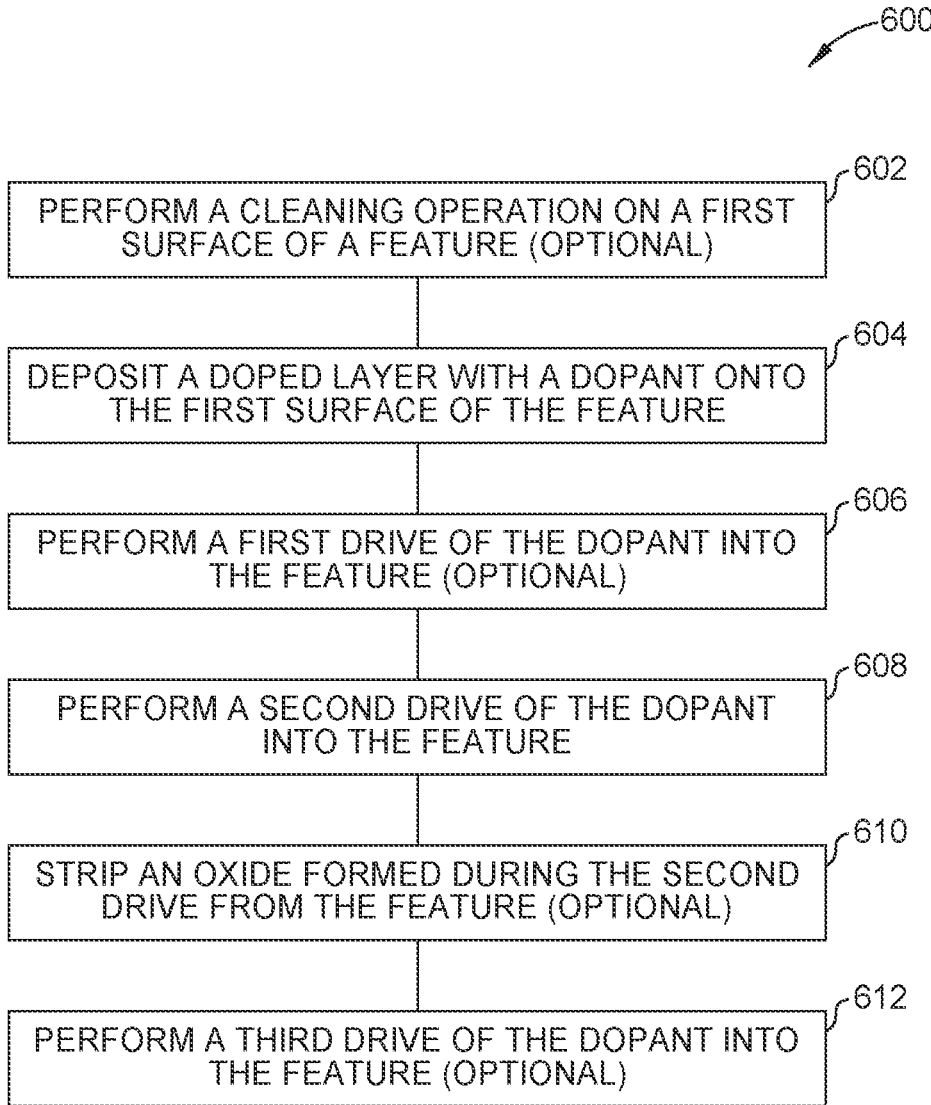
FIG. 6 is a flow diagram illustrating a method of diffusing a dopant into the semiconductor device of FIGS. 4A-4C or FIGS. 5A-5C, according to embodiments of the disclosure.

FIG. 4A illustrates the semiconductor device 400 before a method 600 of FIG. 6 is performed on the semiconductor device 400. The semiconductor device 400 includes a substrate 402 with a plurality of fins 404 disposed therein. A plurality of openings 406 are formed between the plurality of fins 404, such that one opening 406 is formed between each pair of adjacent fins 404. The substrate 402 is one or a silicon or a silicon-germanium substrate. The substrate 402 is a monocrystalline substrate.

Each of the fins 404 of the substrate 402 further include an upper fin portion 410. Each of the upper fin portions 410 are a second layer disposed on top of the plurality of fins 404. The upper fin portions 410 have similar widths as the plurality of fins 404 and form extensions of the plurality of fins 404. The plurality of openings 406 are gaps between each pair of adjacent fins 404 and the upper fin portions 410 disposed on top of the fins 404. The fins 404 may be referred to as lower fin portions or base fin portions. The upper fin portions 410 are formed of a second material different from the material of the substrate 402 and the fins 404. In some embodiments, the upper fin portions 410 are a silicongermanium material while the fins 404 are a silicon material. In some embodiments, the upper fin portions 410 are the same material as the fins 404 and may be a continuous portion of the fins 404. The gap between each pair of adjacent fins 404 is about nm to about 30 nm, such as about 15 nm to about 25 nm, such as about 20 nm.

A portion of each of the openings 406 is filled with an oxide 408. The oxide 408 is disposed on the substrate 402 and fills the entirety of the openings 406 between each of the fins 404, but either does not extend to or only partially extends over the upper fin portions 410. Therefore, the oxide 408 covers a lower end of the upper fin portions 410, but not the upper portion. The oxide 408 is a silicon oxide. The oxide 408 blocks selective deposition of future doped layers on the sidewalls of the fins 404.

Each of the upper fin portions 410 have sidewalls 414 and a top surface 412. The top surface 412 is disposed between the sidewalls 414. The sidewalls 414 form at least a portion of the plurality of openings 406. The top surface 412 is the topmost surface of each of the upper fin portions 410 and is disposed between the sidewalls 414 of each individual upper fin portion 410.

Figure 5A:
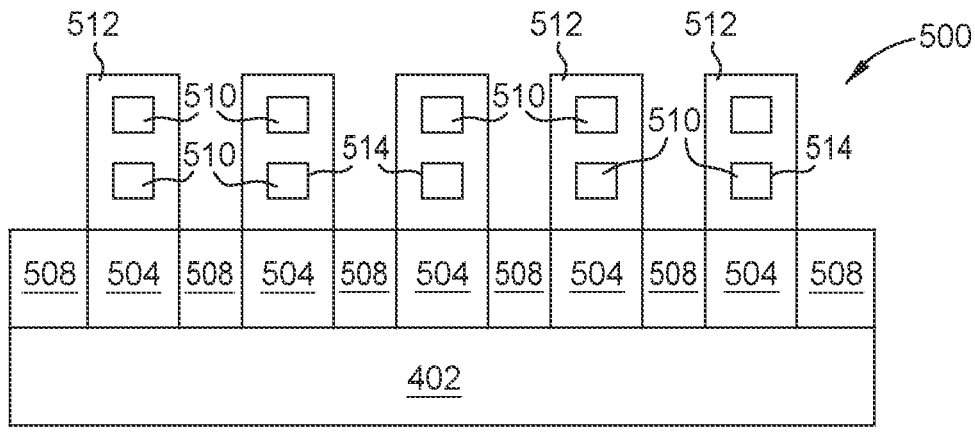
FIGS. 5A-5C are schematic cross-sectional views of another semiconductor device during various stages of formation, according to one or more embodiments of the disclosure.
Figure 5B:
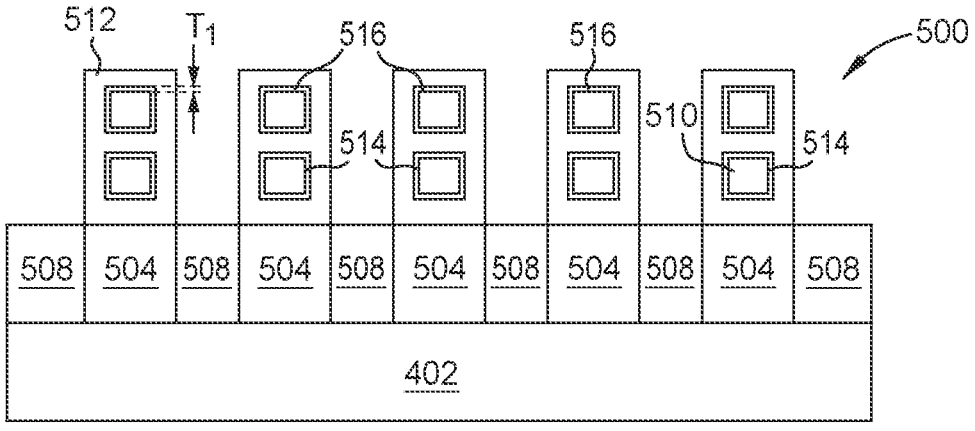
Figure 5C:
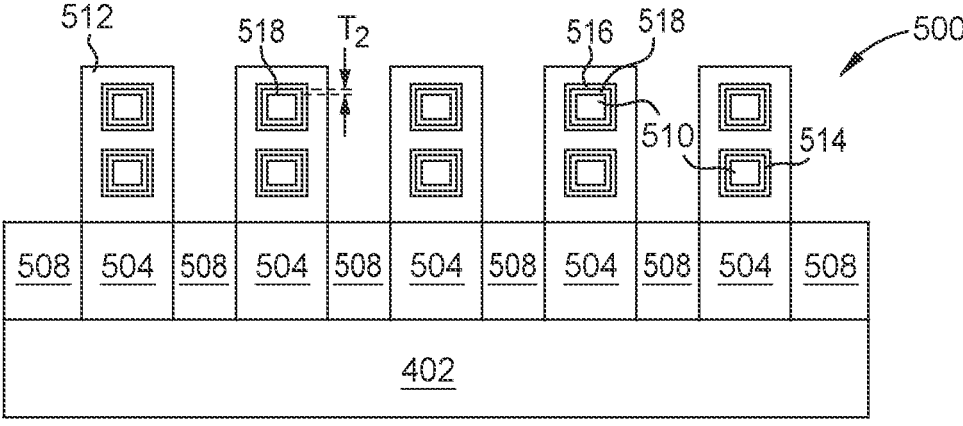

FIG. 5A illustrates the semiconductor device 500 before the method 600 of FIG. 6 is performed on the semiconductor device 500. The semiconductor device 500 includes the substrate 402 with a channels 510 disposed thereon. The semiconductor device 500 is one embodiment of a gate all around (GAA) structure on which the methods described herein may be performed. The semiconductor device 500 of FIGS. 5A-5C is a nanosheet or nanowire metal-oxidesemiconductor field-effect-transistor (MOSFET). The channels 510 are disposed through a gate structure 512, such that the channels 510 form wires or sheets through the gate structure 512. The gate structure 512 is a metal gate structure. The gate structure 512 and the channels 510 are separated from the substrate 402 by one or more sub-layers 504. The one or more sub-layers 504 may include an isolation layer and/or an additional channel layer. An isolation film 508 is disposed on top of the substrate 402 and between the substrate 402 and the gate structure 512. In some embodiments, the isolation film 508 is disposed beneath the gate structure 512 and the channels 510. The isolation film 508 may be an oxide similar to the oxide 408 of FIGS. 4A-4C.

The channels 510 are similar in composition to the upper fin portions 410 of FIGS. 4A-4C. The channels 510 may be a silicon, germanium, or silicon-germanium material and may be doped using one or more dopants. The channels 510 are distinct within the gate structure 512, such that the channels 510 are each separated from one another and from the one or more sub-layers 504 and the substrate 402 by a portion of the gate structure 512. Although shown as rectangular in the cross-section of FIGS. 5A-5C, the channels 510 may also be circular or ovoid. Other cross-sectional shapes are also contemplated.

Each of the channels 510 have an outer surface 514. The outer surface 514 is a bare portion of the channels 510 and includes an upper surface, side surfaces, and a lower surface. The lower surface is not in a direct line-of-sight of a laser scanner as described herein. However, the method 600 described herein, enables conformal growth and diffusion of dopant into the outer surface 514 of the channels 510 regardless of if the surface is in a direct or indirect line-ofsight.

The top surface 412 and as least portions of the sidewalls 414 are cleaned during an operation 602 of the method 600 and exposed as shown in FIG. 4A. Similarly, the outer surface 514 of the channels 510 may also be cleaned during the operation 602 of the method 600. Cleaning of the top surface 412 and the sidewalls 414, or the outer surface 514, during the operation 602 removes any residual and unwanted oxide from the sidewalls 414, the top surface 412, and the outer surface 514. The sidewalls 414 and the top surfaces 412 may collectively form a first surface of each of the features on the substrate, wherein the features are the collective fins 404 and upper fin portions 410. Therefore, the top surface 412 and at least portions of the sidewalls 414 are oxide-free and do not have the oxide 408 disposed thereon. Similarly, after the operation 602, the outer surface 514 of the channels 510 are oxide free.

The cleaning operation 602 may be an etching process, such as a selective etch of oxide from the upper fin portions 410 and the channels 510. The etching process may be a plasma etch or a reactive ion etch and may be performed in a process chamber different from either of the deposition chamber 200 or the surface anneal chamber 300. The cleaning operation 602 is an optional process operation and may include additional process operations therein.

After the sidewalls 414 and the top surface 412 or the outer surface 514 are cleaned during the operation 602, a doped layer 416, 516 is deposited onto the sidewalls 414 and the top surface 412 during an operation 604. The doped layer 416 is the doped film deposited on the upper fin portions 410 while the doped layer 516 is the doped film deposited on the channels 510. The doped layer 416, 516 after the operation 604 is illustrated in FIGS. 4B and 5B. The doped layer 416, 516 is doped with one or more dopants. The one or more dopants are one or more of phosphorous, boron, arsenic, gallium, indium, aluminum, and lithium. In some embodiments, the one or more dopants are one of boron or phosphorous. The doped layer 416, 516 also includes silicon and/or germanium therein. The deposition of the doped layer 416, 516 is performed in a deposition chamber, such as the deposition chamber 200. The doped layer 416, 516 is epitaxially deposited. Therefore the doped layer 416, 516 is crystalline layer. In some embodiments, other deposition chambers and deposition processes may be used to form the doped layer 416, 516. Other processes which may form the doped layer include an atomic layer deposition (ALD) process or other chemical vapor deposition (CVD) processes. The doped layer 416, 516 is selectively deposited onto the upper fin portions 410 and the channels 510. Therefore the doped layer 416, 516 is averse to depositing on the oxide 408 of FIGS. 4A-4B and the isolation film 508 of FIGS. 5A-5C as the oxide blocks the doped layer 416, 516 growth.

The deposition of the doped layer 416, 516 includes a thermal decomposition process. The thermal decomposition process includes exposing the sidewalls 414 and the top surface 412 or the outer surface 514 to a dopant precursor at a temperature in a range of about 600° C. to about 900° C., such as about 700° C. to about 800° C.

In some embodiments, the dopant precursor which forms the doped layer 416, 516 is a boron or a phosphorus precursor. The boron precursor includes or consists essentially of one or more of borane ($BH_3$), diborane ($B_2H_6$), triborane ($B_3H_5$, $B_3H_7$), tetraborane ($B_4H_6$, $B_4H_{10}$), pentaborane ($B_5H_9$, $B_5H_{11}$) or a cyclic triborane ($B_3H_6$) or a cyclic tetraborane ($B_4H_8$). Additional examples of suitable boron precursors include boron halides such as $BCl_3$, or alkyl substituted boron compounds having the formula $BH_xR_{3-x}$, wherein each R is an independently selected C1-C6 alkyl group and x is 0, 1 or 2. Specific examples of alkyl substituted boron compounds include trimethylboron and triethylboron.

The phosphorus precursor includes or consists essentially of phosphine ($PH_3$). In some embodiments, the dopant precursor is an arsenic precursor and the dopant film include arsenic. In some embodiments, the arsenic precursor includes or consists essentially of arsine ($AsH_3$).

In some embodiments, the doped layer 416, 516 is an amorphous dopant layer. The doped layer 416, 516 is conformal over the sidewalls 414 and the top surface 412 as well as the outer surface 514, such that the thickness of the doped layer 416, 516 varies by less than or equal to about 10%, 5%, 2%, 1%, or Deposition of the doped layer 416, 516 is performed using a non-line of sight deposition process. Accordingly, in some embodiments, the doped layer 416, 516 deposits conformally on all exposed, such as all of the outer surface 514 of each of the channels 510 regardless of their "visibility." Therefore, the methods described herein are particularly beneficial when forming a GAA or horizontal GAA (hGAA) structure as shown in FIGS. 5A-5C. Non-line of sight deposition is also beneficial in embodiments in which the upper fin portions 410 are diamond fins, as not all surfaces may be "visible" to line of sight processes. Therefore, epitaxial chemical vapor deposition processes are particularly beneficial when applied to structures which would have surfaces which are not "visible," such as diamond fins, HGAA structures, or nanowire structures.

The doped layer 416, 516 has a dopant concentration of greater than about $1 \cdot 10^{21}$ atoms/cm³, such as greater than about $1 \cdot 10^{22}$ atoms/cm³, such as greater than about $5 \cdot 10^{22}$ atoms/cm³, such as greater than about $1 \cdot 10^{23}$ atoms/cm³. The amount of dopant within the doped layer 416, 516 is utilized to help provide a source of dopant and directly correlates to the amount of dopant which may be later diffused into the sidewalls 414 and the top surface 412 or the outer surface 514. The doped layer 416, 516 has a first thickness $T_1$. The first thickness $T_1$ is about 0.1 nm to about 2 nm, such as about 0.5 nm to about 1.5 nm, such as about 0.7 nm to about 1.3 nm, such as about 0.9 nm to about 1.1 nm. The thickness of the doped layer 416, 516 enables an adequate amount of dopant to be disposed therein, while still enabling subsequent laser anneals to be effective to a desired depth. In some embodiments, the doped layer 416, 516 has a first thickness $T_1$ of several monolayers, such as about 2 to about 10 monolayers.

After depositing the doped layer 416, 516 during the operation 604, an operation 606 is performed in which the dopant is driven or diffused into the sidewalls 414 and the top surface 412, or the outer surface 514, during a first drive operation. The operation 606 is performed in a surface anneal chamber, such as the surface anneal chamber 300. The substrate on which the method 600 is being performed is transferred from the deposition chamber to the surface anneal chamber between the operation 604 and the operation 606, such that there is also a substrate transfer operation. During the operation 606, the dopant is diffused into the sidewalls 414/top surface 412 or the outer surface 514 using a DSA process operation. The dopant is diffused into the sidewalls 414 and the top surface 412 of the upper fin portions to a first diffusion depth. The dopant is similarly diffused into the outer surface 514 of the channels 510 to the first diffusion depth. The first diffusion depth is about 0.05 nm to about 60 nm, such as about nm to about 1 nm or about 1 nm to about 60 nm, such as about 1 nm to about nm, such as about 10 nm to about 30 nm, such as about 10 nm to about 25 nm, such as about 15 nm to about 25 nm.

The DSA processes deliver a constant energy flux from an energy source, such as the laser source 308, to a small region on the target surface of the substrate while the substrate is translated, or scanned, relative to the energy (or vice versa) delivered to the small region. The energy source delivers electromagnetic radiation energy to perform the annealing process at desired regions of the substrate. The laser source 308 may include or be substituted for any one of an optical radiation source, an electron beam source, an ion beam source, and/or a microwave energy source, any of which may be monochronistic or polychronistic and may have any desired coherency. In one implementation, the energy source is an optical radiation source using one or more laser sources. The lasers, such as the laser beam 312, may be any type of laser such as gas laser, excimer laser, solid-state laser, fiber laser, semiconductor laser etc., which may be configurable to emit light at a single wavelength or at two or more wavelengths simultaneously.

The first drive performed during the operation 606 includes applying a plurality of short-duration laser pulses to the substrate and the semiconductor device 400, 500 disposed onto the substrate. In some embodiments, the laser source 308 is configured to emit one or more laser pulses, such as a plurality of laser pulses, with a pulse duration of less than about 1 second, such as less than about 0.5 seconds, such as less than about 0.1 seconds. In some implementations, millisecond laser pulses are applied with a pulse duration of less than about 100 millisecond, such as less than about 50 milliseconds, such as less than about 1 millisecond. In some implementations, nanosecond laser pulses are applied. The nanosecond laser pulses have a pulse duration from a few nanoseconds to about 200 nanoseconds, such as about 5 nanoseconds to about 200 nanoseconds, such as about 10 nanoseconds and 100 nanoseconds, such as about 10 nanoseconds to about 50 nanoseconds, such as about 20 nanoseconds.

The energy delivered in each pulse may be between about 10 mJ/cm² and 1.0 J/cm², such as between about 100 mJ/cm² and about 500 mJ/cm², for example about 300 mJ/cm². The repetition rate of the energy pulse is about 1 kHz and about 1 MHz, such as about 10 kHz to about 250 kHz, such as about 25 kHz to about 150 kHz, such as about 50 kHz to about 100 kHz. The laser pulse exposure of the substrate includes one or more laser pulses during the laser anneal process. The laser pulse exposure therefore includes 21 to 100 pulses, such as 2 to 100 pulses, such as 5 to 50 pulses, such as 5 to 30 pulses, such as to 30 pulses. In some embodiments, the laser source 308 is configured to emit the laser beam 312 with a wavelength of about 10 nm to about 2,000 nm, such as about 190 nm to about 1064 nm, such as about 365 nm to about 536 nm.

Each of the laser pulses during the operation 606 anneals the exposed portion of the substrate at a first temperature, such that the exposure of the substrate to the laser pulses heats the exposed portion of the substrate to the first temperature for a duration of similar length to or less than the pulse duration. The first temperature is a temperature of about 800° C. to about 1410° C., such as about 800° C. to about 1200° C., such as about 800° C. to about 1100° C., such as about 800° C. to about 1000° C., such as about 800° C. to about 900° C., such as about 850° C. The first temperature is less than a second temperature during a second drive as well as a third temperature during a third drive as described below. The lower first temperature is used during an initial diffusion, such that during the first drive of operation 606, the dopant may begin to be diffused. Lowering the first temperature compared to a second temperature and a third temperature enables controlled diffusion of the dopant into the device surface without the presence of oxygen potentially interfering with the initial dopant diffusion while still enabling the second drive and the third drive to perform a greater amount of diffusion.

During the operation 606, an inert gas is introduced and fills the process volume around the substrate, such as the process volume 336. The inert gas is one or a combination of argon, nitrogen, helium, neon, krypton, and xenon. The inert gas completely fills the process volume, such that the partial pressure of the inert gas within the process volume is 99.9% or more, such as 99.95% or more, such as 99.99% or more of the gas within the process volume. The pure or near pure inert gas within the process volume assists in reducing chemical reactions within the top surface of the substrate other than the diffusion of the dopant. The operation 606 is an oxygen-free operation, such that the process volume is void of oxygen gas or nearly void of oxygen gas. By utilizing the operation 606 without any oxygen gas, the dopant is diffused into the surface of the device structure without oxygen forming an oxide and blocking initial diffusion. The initial dopant diffusion during the operation 606 provides a base doping of the device which enhances later diffusion operations. If oxygen was present within the process volume during the operation 606, the diffusion of the dopant within the surface of the service may be reduced during later process operations as the oxygen could form an oxide on the device surface and restrict dopant diffusion by forming a partial barrier to further dopant diffusion. The presence of an already doped region formed during the operation 606 enables the dopant already within the sidewalls 414/top surface 412 and the outer surface 514 to be diffused during later drive operations as well as the diffusion of dopant still within the doped layer 416, 516 to be diffused during later drive operations. The pressure within the process volume during the operation 608 is about 0.1 atmosphere to about 5.0 atmosphere, such as about 0.5 atmosphere to about 4.0 atmosphere, such as about 0.8 atmosphere to about 3.0 atmosphere, such as about 0.9 atmosphere to about 2.0 atmosphere, such as about 1.0 atmosphere. In some embodiments, the pressure may be higher than 5.0 atmosphere to enable reduced temperatures and reduced thermal load on the semiconductor device 400, 500.

The first drive during the operation 606 assists in beginning the diffusion of the dopant into the sidewalls 414/top surface 412 or the outer surface 514. The diffusion of the dopant into the sidewalls 414 and the top surface 412 forms a doped region 418 as illustrated in FIG. 4C. Similarly, the diffusion of the dopant into the outer surface 514 forms a doped region 518 as illustrated in FIG. 5C. The doped region 418, 518 is uniform and formed directly underneath the doped layer 416, 516. It has been found that by utilizing the DSA process operations, the doping of the sidewalls 414/top surface 412 and the outer surface 514 is performed uniformly whether the surface is directly exposed, partially exposed, or out of sight of a radiation source, such as a laser. The uniform diffusion of the dopant regardless of if the surface is in a direct line-of-sight is partially due to the concentration of dopant atoms within the doped layer 416, 516. The dopant concentration within the doped layer 416, 516 is uniform regardless of line-of-sight to the exposed surface as deposition is not dependent upon orientation of the surface in embodiments described herein. The DSA process operations the device structure is heated to diffuse the dopant atoms from the doped layer 416, 516 and to form the doped region 418, 518. Due to the high concentration of dopant atoms within the doped layer 416, 516 relative to the amount of dopant atoms which are diffused into the doped region 418, 518, the dopant diffusion is dependent upon the thermal energy provided by the DSA process operations. Using methods described herein, the thermal energy across the device structure is shown to be uniform and therefore, the diffusion of the dopant atoms into the doped region 418, 518 is uniform.

The DSA process may be a scanning DSA process. Since the doped layer 416, 516 is not deposited on the oxide 408 or the isolation film 508, the dopant does not diffuse into the oxide 408/isolation film 508 or regions which the oxide 408/isolation film 508 cover. In some embodiments, there may be a small amount of diffusion at a boundary between the doped layer 416 and the oxide 408. The reduced first temperature of the first drive as well as the low number of laser pulses applied to the substrate reduce deformation and stress induced in the substrate during the method 600.

After the first drive during the operation 606, a second drive is performed on the sidewalls 414/top surface 412 or the outer surface 514. The operation 608 is performed in a surface anneal chamber, such as the surface anneal chamber 300. The operation 608 is a DSA operation similar to operation 606, but includes a small amount of oxygen, such as about 1% to about 10% by pressure or about 1% to about 5% by pressure, within the process region surrounding the substrate and may have a different number of pulses delivered to the substrate. The power, duration, and wavelength of the operation 608 may also be varied compared to the operation 606. Both of the first drive and the second drive during the operation and operation 608 are performed in the same surface anneal chamber. During the operation 608, the dopant is further diffused into the sidewalls 414/top surface 412, or the outer surface 514, using a second DSA process operation. The second drive may also be referred to as an oxygenated dynamic surface anneal.

The second drive performed during the operation 608 includes applying a plurality of short-duration laser pulses to the substrate and the semiconductor device 400 disposed onto the substrate. In some embodiments, the laser source is configured to emit one or more laser pulses, such as a plurality of laser pulses, with a pulse duration of less than about 1 second, such as less than about 0.5 seconds, such as less than about 0.1 seconds. In some implementations, millisecond laser pulses are applied with a pulse duration of less than about 100 millisecond, such as less than about 50 milliseconds, such as less than about 1 milliseconds. In some implementations, nanosecond laser pulses are applied. The nanosecond laser pulses have a pulse duration from a few nanoseconds to about 200 nanoseconds, such as about 5 nanoseconds to about 200 nanoseconds, such as about 10 nanoseconds and 100 nanoseconds, such as about 10 nanoseconds to about 50 nanoseconds, such as about 20 nanoseconds. In some embodiments, the operation 608 is performed at a higher temperature and shorter pulse durations are utilized.

The energy delivered in each pulse may be between about 10 mJ/cm$^2$ and 1.0 J/cm$^2$, such as between about 100 mJ/cm$^2$ and about 500 mJ/cm$^2$, for example about 300 mJ/cm$^2$. The repetition rate of the energy pulse is about 1 kHz and about 1 MHz, such as about 10 kHz to about 250 kHz, such as about 25 kHz to about 150 kHz, such as about 50 kHz to about 100 kHz. The laser anneal process includes 1 to 100 pulses, such as 1 to 50 pulses, such as 1 to 30 pulses, such as 2 to 15 pulses, such as 2 to 5 pulses. In embodiments in which the first drive and the operation 606 are performed previous to the second drive and operation 608, the number of energy pulses delivered during operation 608 is reduced. Therefore, when operation 606 is performed, the number of energy pulses delivered is 1 to 15 pulses, such as 1 to 10 pulses, such as 1 to 5 pulses, such as 1 pulse. Conversely, in embodiments in which operation 606 is not performed, the number of energy pulses delivered during operation 608 is increased. Therefore, when operation 606 is not performed during the method 600, the number of energy pulses delivered is 2 to 100 pulses, such as 2 to 50 pulses, such as 2 to 30 pulses, such as 2 to 15 pulses, such as 2 to 5 pulses. Performing less overall laser pulses on the substrate reduces the amount of strain introduced into the features and reduces overall deformation of the substrate. Each of the pulse energy, the repetition rate, and the number of pulses may be either the same or different between the operation 606 and the operation 608.

In some embodiments, the laser source 308 is configured to emit the laser beam 312 with a wavelength of about 10 nm to about 2,000 nm, such as about 190 nm to about 1064 nm, such as about 365 nm to about 536 nm. Each of the laser pulses during the operation 608 anneals the exposed portion of the substrate at a second temperature, such that the exposure of the substrate to the laser pulses heats the exposed portion of the substrate to the second temperature for a duration of similar length to or less than the pulse duration. The second temperature is a temperature of greater than about 800° C., such as about 800° C. to about 1410° C., such as about 800° C. to about 1300° C., such as about 800° C. to about 1100° C., such as about 800° C. to about 1000° C., such as about 800° C. to about 900° C., such as about 850° C. or about 1150° C.

During the operation 608, an inert gas is introduced into the process volume around the substrate, such as the process volume 336. The inert gas is one or a combination of argon, nitrogen, helium, neon, krypton, and xenon. The partial pressure of the inert gas within the process volume is about 85% to about 99%, such as about 90% to about 99%, such as about 95% to about 99%, such as about 97% to about 99%, such as about 98% to about 99% of the gas within the process volume. The remaining gas within the process volume is an oxygen gas, such that the partial pressure of oxygen gas within the process volume is about 1% to about 15%, such as about 1% to about 10%, such as about 1% to about 5%, such as about 1% to about 3%, such as about 1% to about 2% of the gas within the process volume. The oxygen gas comprises one or a combination of oxygen gas ($O_2$) or ionic oxygen ($O^{2-}$). In some embodiments, water molecules ($H_2O$) are utilized. In some embodiments, the oxygen gas is referred to as an oxygen containing gas, such that atoms or molecules other than oxygen are contained within the oxygen containing gas. Other oxygen-containing gases may also be utilized. The low amount of oxygen mixed with the inert gas has been shown to enable a reduced processing pressure during the operation 608 and also reduces the total amount of laser pulse exposures used to obtain a desired dopant diffusion profile. The reaction of oxygen at the surface of the silicon or silicon-germanium material layers has been shown to cause interstitial atoms to diffuse from the outer surface, such as the sidewalls 414/top surface 412 or the outer surface 514, and therefore enhance the diffusivity of dopants into the sidewalls 414/top surface 412 and the outer surface 514. The amount of oxygen is kept low to reduce the amount of oxidation of the sidewalls 414/top surface 412, or the outer surface 514, low. The pressure within the process volume during the operation 608 is about 0.1 atmosphere to about 5.0 atmosphere, such as about 0.1 atmosphere to about 4.0 atmosphere, such as about 0.1 atmosphere to about 2.0 atmosphere, such as about 0.5 atmosphere to about 1.5 atmosphere, such as about 0.8 atmosphere to about 1.2 atmosphere, such as about 0.9 atmosphere to about 1.1 atmosphere, such as about 1.0 atmosphere. In some embodiments, the pressure during the operation 608 is greater than about 5.0 atmosphere to enable reduced temperatures and reduced thermal load of the semiconductor device 400, 500.

The operation 608 further diffuses the doped region 418 into the sidewalls 414 and the top surface 412 of the upper fin portions 410. The operation 608 may also be utilized to further diffuse the doped region 518 into the outer surface 514 of the channels 510. The sidewalls 414/top surface 412, or the outer surface 514, may be referred to more generally as features of the substrate or the semiconductor device 400, 500. After diffusing the dopant into the upper fin portions 410 or the channels 510 during the operation 608, the doped region 418, 518 has a second thickness T$_2$. The second thickness T$_2$ is about 0.5 nm to about nm, such as about 1 nm to about 8 nm, such as about 2 nm to about 5 nm. In some embodiments, the second thickness T$_2$ is greater than or equal to about 1 nm, such as greater than or equal to about 2 nm, such as greater than or equal to about 5 nm. The doped region 418, 518 after the operation 608 is defined as a region of the substrate which has a dopant concentration of greater than about $1 \cdot 10^{12}$ atoms/cm$^3$, such as greater than about $1 \cdot 10^{13}$ atoms/cm$^3$, such as greater than about $1 \cdot 10^{14}$ atoms/cm$^3$, greater than about $1 \cdot 10^{18}$ atoms/cm$^3$, such as greater than about $1 \cdot 10^{18}$ atoms/cm$^3$, such as greater than about $1 \cdot 10 \cdot 10^{18}$ atoms/cm$^3$. In some applications, a lower dopant concentration with a greater depth is beneficial. Therefore, the operation 608 may be utilized to increase the depth of the dopant activation and diffusion, but enables reduced dopant concentration throughout the doped region 418, 518. Due to the use of the DSA exposures during the first and second drives of operations 606 and 608, the uniformity of the dopant within the doped region 418, 518 is greater and declines less rapidly than if the operation 608 was not performed.

After the formation of the doped region 418, 518 during the operations 606 and 608, a cleaning process is optionally performed on the substrate and the semiconductor device 400 or the semiconductor device 500 during an operation 610. The cleaning process of operation 610 is performed in a different chamber than the operations 606 and 608. In some embodiments, the operation 610 is eliminated if both of the doped film 416, 516 and the annealing operations are performed within an integrated system without exposure to atmosphere. In these embodiments, the substrate is transferred through an inert atmosphere from one process chamber or process volume to another process chamber or process volume to avoid any oxide growth prior to the anneal. The operation 610 is configured to strip any oxide which is formed during the operation 608 on the doped layer 416 or the doped layer 516. The cleaning process of operation 610 may be an etch process, such that the oxide formed on the semiconductor device 400, 500 during the operation 608 is etched from the semiconductor device 400, 500. The etch process may be a plasma etch process or a radical etch process. Other cleaning operations are also contemplated. In embodiments in which the amount of oxygen within the process volume during the operation 608 is below about 5%, such as about 1% to about 5% or about 1% to about 3%, the cleaning process of operation 610 is optional.

After performing the second drive during the operation 608 and stripping the oxide during the operation 610, a third drive may be optionally performed during an operation 612. The third drive of the operation 612 further drives/diffuses the dopant into the upper fin portions 410 or the channels 510. To perform the third drive, the substrate is moved back into a surface anneal chamber, such as the surface anneal chamber 300. In some embodiments, the third drive is performed in the same surface anneal chamber as each of the first and second drives during operations 606 and 608. Alternatively, the third drive is performed in a different surface anneal chamber than either of the first drive or the second drive. The third drive may be utilized in embodiments where it is beneficial to drive the dopant deeper in to the device structure. In embodiments in which a shallower dopant diffusion is desired, the third drive and the operation 612 are omitted.

The third drive is similar to the first drive in that it is a DSA process and anneals the substrate using a one or more laser pulses. The third drive performed during the operation 612 therefore includes applying a plurality of short-duration laser pulses to the substrate and the semiconductor device 400, 500 disposed onto the substrate. In some embodiments, the laser source 308 is configured to emit, one or more laser pulses, such as a plurality of laser pulses, with a pulse duration of less than about 1 second, such as less than about 0.5 seconds, such as less than about 0.1 seconds. In some implementations, millisecond laser pulses are applied with a pulse duration of less than about 100 millisecond, such as less than about 50 milliseconds, such as less than about 1 milliseconds. In some implementations, nanosecond laser pulses are applied. The nanosecond laser pulses have a pulse duration from a few nanoseconds to about 200 nanoseconds, such as about 5 nanoseconds to about 200 nanoseconds, such as about 10 nanoseconds and 100 nanoseconds, such as about 10 nanoseconds to about 50 nanoseconds, such as about 20 nanoseconds.

The energy delivered in each pulse may be between about 10 mJ/cm$^2$ and 1.0 J/cm$^2$, such as between about 100 mJ/cm$^2$ and about 500 mJ/cm$^2$, for example about 300 mJ/cm$^2$. The repetition rate of the energy pulse is about 1 kHz and about 1 MHz, such as about 10 kHz to about 250 kHz, such as about 25 kHz to about 150 kHz, such as about 50 kHz to about 100 kHz. The laser pulse exposure of the substrate includes one or more laser pulses during the laser anneal process. The laser pulse exposure therefore includes 2 to 100 pulses, such as 5 to 50 pulses, such as 5 to 30 pulses, such as 10 to 30 pulses. The number of laser pulses delivered during the third drive may be equal to the number of laser pulses delivered during the first drive. In some embodiments, the number of laser pulses delivered during the third drive is different than the number of laser pulses delivered during the first drive. The number of laser pulses delivered during the third drive may be less than during either of the first drive or the second drive as the third drive is utilized to finalize the dopant diffusion process. In some embodiments, the laser source 308 is configured to emit the laser beam 312 with a wavelength of about 10 nm to about 2,000 nm, such as about 190 nm to about 1064 nm, such as about 365 nm to about 536 nm. Each of the pulse energy, the repetition rate, and the number of pulses may be either the same or different between the operations 606, 608 and the operation 612.

Each of the laser pulses during the operation 612 anneals the exposed portion of the substrate at a third temperature, such that the exposure of the substrate to the laser pulses heats the exposed portion of the substrate to the third temperature for a duration of similar length to or less than the pulse duration. The third temperature is a temperature of greater than about 800° C., such as about 800° C. to about 1410° C., such as about 800° C. to about 1200° C., such as about 900° C. to about 1200° C., such as about 1000° C. to about 1200° C., such as about 1100° C. to about 1200° C., such as about 1150° C.

During the operation 612, an inert gas is introduced and fills the process volume around the substrate, such as the process volume 336. The inert gas is one or a combination of argon, nitrogen, helium, neon, krypton, and xenon. The inert gas completely fills the process volume, such that the partial pressure of the inert gas within the process volume is 99.9% or more, such as 99.95% or more, such as 99.99% or more of the gas within the process volume. The pressure within the process volume during the operation 612 is about 0.1 atmosphere to about 5.0 atmosphere, such as about 0.1 atmosphere to about 4.0 atmosphere, such as about 0.1 to about 2.0 atmosphere, such as about 0.5 atmosphere to about 1.5 atmosphere, such as about 0.8 atmosphere to about 1.2 atmosphere, such as about 0.9 atmosphere to about 1.1 atmosphere, such as about 1.0 atmosphere. In some embodiments, the pressure during the operation 612 is greater than about 5.0 atmosphere to enable reduced temperatures and reduced thermal load of the semiconductor device 400, 500.

The third temperature is greater than the first temperature. It is found higher temperatures generate more interstitial dopant regions within a lattice structure of the substrate. The increase in the number of interstitial dopant regions enables the dopant to be more easily diffused throughout the thickness of the features of the semiconductor device 400, 500. To increase the number of interstitial dopant regions, at least one of the second temperature or the third temperature are greater than about 1000° C., such as greater than about 1100° C., such as greater than about 1150° C.

In some embodiments, each of the first drive, the second drive, and the third drive during the operations 606, 608, and 612 include oxygen within the process volume, such that the partial pressure of oxygen within the process volume is about 0.1% to about 10%. The amount of oxygen within each of the drive operations 606, 608, and 612 may vary between each operation, such that the first drive during operation 606 has a smaller partial pressure of oxygen than the second drive or the third drive during operations 608 and 612.

As discussed, the utilization of a drive-in operation which utilizes a small amount of oxygen gas has been shown to reduce the overall temperatures needed to obtain a desired dopant profile within a feature of a substrate. The reduced annealing temperature is less than about 1400° C., such as less than about 1300° C., such as less than about 1250° C. The reduced annealing temperature prevents melting of the substrate. The use of the oxygen has also been shown to reduce the number of cycles of radiation exposure which are used to obtain the desired dopant profile. Although fin structures are illustrated herein, similar methodology may also be utilized on other structures, such as gate all around structures or flat surfaces.

While the foregoing is directed to embodiments of the present disclosure, other and further embodiments of the disclosure may be devised without departing from the basic scope thereof, and the scope thereof is determined by the claims that follow.

What is claimed is:

1. A method of diffusing a dopant, suitable for use during semiconductor processing, comprising:

flowing an inert gas into a process volume of a process chamber;

flowing an oxygen containing gas into the process volume such that an oxygen partial pressure of the oxygen containing gas is about 0.1% to about 10% within the process volume; and exposing a portion of a substrate within the process volume to one or more laser pulses to heat the portion of the substrate to a temperature of greater than about 850° C. and diffuse the dopant into the substrate, wherein a layer with a dopant concentration of greater than about $1 \cdot 10^{20}$ atoms/cm$^3$ is on a top surface of the substrate during exposing of the portion of the substrate to the one or more laser pulses.

2. The method of claim 1, wherein each laser pulse of the one or more laser pulses has a duration of less than about 1 second.

3. The method of claim 2, wherein each of the laser pulses of the one or more laser pulses has a wavelength of about 200 nm to about 20000 nm.

4. The method of claim 3, wherein each of the laser pulses of the one or more laser pulses has a power density of about 0.1 W/cm$^2$ to about 10 W/cm$^2$.

5. The method of claim 1, wherein the inert gas is one or a combination of argon, nitrogen, helium, neon, krypton, and xenon.

6. The method of claim 1, wherein there are 1 to 50 individual laser pulses in the one or more laser pulses.

7. The method of claim 1, wherein the temperature of the portion of the substrate during exposure is about 850° C. to about 1410° C.

8. The method of claim 1, wherein the dopant is one or a combination of phosphorous, boron, arsenic, gallium, indium, aluminum, and lithium.

9. A method of diffusing a dopant, suitable for use during semiconductor processing, comprising:

depositing a doped layer with a dopant, the doped layer having a dopant concentration of greater than about $1 \cdot 10^{20}$ atoms/cm$^3$ on a top surface of a substrate in a first process chamber; and performing an oxygenated dynamic surface anneal comprising:

flowing an inert gas into a process volume of a second process chamber;

flowing an oxygen gas into the process volume of the second process chamber such that an oxygen partial pressure of the oxygen gas is about 0.1% to about 10% within the process volume; and exposing a portion of a substrate within the process volume to a one or more laser pulses to heat the portion of the substrate to a temperature of greater than about 800° C.

10. The method of claim 9, further comprising performing a first dynamic surface anneal within the second process chamber before performing the oxygenated dynamic surface anneal, the first dynamic surface anneal comprising:

flowing an inert gas into the process volume of the second process chamber, such that an inert gas partial pressure of the inert gas is greater than 99.9% within the process volume; and exposing the portion of a substrate within the process volume to a plurality of first laser pulses.

11. The method of claim 9, wherein the doped layer has a concentration of greater than about $1 \cdot 10^{21}$ atoms/cm$^3$ and a thickness of about 0.1 nm to about 2 nm.

12. The method of claim 9, wherein each laser pulse of the one or more laser pulses has a duration of less than about 0.1 second.

13. The method of claim 9, wherein the inert gas is one or a combination of argon gas, nitrogen gas, helium, neon, krypton, and xenon.

14. The method of claim 9, wherein there are 1 to 15 individual laser pulses in the one or more laser pulses.

15. The method of claim 9, wherein the dopant is one or a combination of phosphorous, boron, arsenic, gallium, indium, aluminum, and lithium.

16. A method of diffusing a dopant, suitable for use during semiconductor processing, comprising:

selectively depositing a doped layer with a dopant on a top surface of a substrate within a first process chamber, the doped layer having a dopant concentration of greater than about $1 \cdot 10^{21}$ atoms/cm$^3$; and performing an oxygenated dynamic surface anneal to diffuse the dopant into the substrate comprising:

flowing an inert gas into a process volume of a second process chamber;

flowing an oxygen gas into the process volume of the second process chamber such that an oxygen partial pressure of the oxygen gas is about 0.1% to about 10% within the process volume; and exposing a portion of a substrate within the process volume to a plurality of laser pulses to heat the portion of the substrate to a temperature of greater than about 800° C. and diffuse the dopant into the substrate; and removing an oxide formed on the substrate after the diffusing the dopant.

17. The method of claim 16, wherein after diffusing the dopant, the substrate has a second dopant concentration of greater than about $1 \cdot 10^{12}$ atoms/cm$^3$ at a depth of about 20 nm from the top surface.

18. The method of claim 16, wherein the temperature of the portion of the substrate during exposure to the plurality of laser pulses is less than about 1200° C.

\* \* \* \* \*